(12) United States Patent
Reddy Arava et al.

(10) Patent No.: US 12,507,454 B2
(45) Date of Patent: Dec. 23, 2025

(54) METHOD FOR FABRICATING WAFER SCALE/NANO SUBMICRON GAP ELECTRODES AND ARRAYS VIA PHOTOLITHOGRAPHY

(71) Applicant: Wayne State University, Detroit, MI (US)

(72) Inventors: Leela Mohana Reddy Arava, Troy, MI (US); Nirul Masurkar, Detroit, MI (US)

(73) Assignee: Wayne State University, Detroit, MI (US)

(*) Notice: Subject to any disclaimer, the term of this patent is extended or adjusted under 35 U.S.C. 154(b) by 89 days.

(21) Appl. No.: 18/368,812

(22) Filed: Sep. 15, 2023

(65) Prior Publication Data

US 2024/0120389 A1   Apr. 11, 2024

Related U.S. Application Data

(62) Division of application No. 16/755,192, filed as application No. PCT/US2018/055089 on Oct. 9, 2018, now Pat. No. 11,784,227.

(60) Provisional application No. 62/571,820, filed on Oct. 13, 2017.

(51) Int. Cl.
*H10D 64/01* (2025.01)
*G01N 27/414* (2006.01)
*H10D 30/67* (2025.01)

(52) U.S. Cl.
CPC ......... *H10D 64/01* (2025.01); *G01N 27/4143* (2013.01); *G01N 27/4145* (2013.01); *G01N 27/4146* (2013.01); *H10D 30/6729* (2025.01)

(58) Field of Classification Search
CPC ............ H01L 21/0272; H01L 21/0331; H01L 21/7688; H01L 2224/2747–27474; G01N 27/414–4148
See application file for complete search history.

(56) References Cited

U.S. PATENT DOCUMENTS

2005/0112860 A1* 5/2005 Park ................. H10K 10/701
977/840
2006/0278879 A1* 12/2006 Busta ................ B81C 1/00071
430/311

(Continued)

FOREIGN PATENT DOCUMENTS

CN    104237357 A    12/2014
CN    106957055 A    7/2017

(Continued)

OTHER PUBLICATIONS

Grimblot and Eldridge, "II. Oxidation of Al Films" Journal of the Electrochemical Society, vol. 129(10), pp. 2369-2372 (1982) (Year: 1982).*

(Continued)

*Primary Examiner* — Erik Kielin
(74) *Attorney, Agent, or Firm* — Fishman Stewart PLLC

(57) ABSTRACT

A electronic device and a fabrication method is provided. The electronic device having a first electrode and a second electrode. A nano-gap is formed between first and second electrode. The first electrode, the second electrode and the gap may be located in the same layer of the device. A two-dimensional layer of graphene may cover the gap.

20 Claims, 6 Drawing Sheets

(56) References Cited

U.S. PATENT DOCUMENTS

| | | | |
|---|---|---|---|
| 2007/0059645 A1* | 3/2007 | Tang | H10K 10/82 |
| | | | 430/311 |
| 2011/0311839 A1* | 12/2011 | Kamimura | G11B 5/855 |
| | | | 216/22 |
| 2013/0018599 A1 | 1/2013 | Peng | |
| 2013/0119349 A1 | 5/2013 | Chung | |
| 2016/0097764 A1 | 4/2016 | Taslim | |
| 2016/0304350 A1 | 10/2016 | Deemer et al. | |
| 2016/0320364 A1* | 11/2016 | Ikeda | C23C 16/45525 |
| 2017/0145483 A1 | 5/2017 | Briggs et al. | |
| 2018/0180573 A1 | 6/2018 | Lin | |
| 2019/0376925 A1* | 12/2019 | Choi | G01N 33/48721 |
| 2019/0383770 A1 | 12/2019 | Choi | |

FOREIGN PATENT DOCUMENTS

| | | | | |
|---|---|---|---|---|
| EP | 1730591 B1 | 12/2006 | | |
| JP | 2008124188 A | 5/2008 | | |
| KR | 101778214 B1 | 9/2017 | | |
| WO | 2014017592 A1 | 1/2014 | | |
| WO | WO-2018050965 A1 * | 3/2018 | | G01P 15/0894 |

OTHER PUBLICATIONS

U.S. Appl. No. 62/425,283 Drawings and Specification (Year: 2019).*

International Search Report dated Feb. 1, 2019 for copending International Application No. PCT/US18/55089.

Shao et al., "Sulfur dioxide 1nolecule sensors based on zigzag graphene nanoribbons with and without Cr dopant," Physics Letters A 378 (2014), pp. 667-671 (Year: 2014).

U.S. Appl. No. 62/425,283 Drawings and Specification (Year: 2016).

* cited by examiner

METHOD FOR FABRICATING WAFER SCALE/NANO SUBMICRON GAP ELECTRODES AND ARRAYS VIA PHOTOLITHOGRAPHY

RELATED APPLICATIONS

This application is a divisional of and claims priority to U.S. patent application Ser. No. 16/755,192, filed Apr. 10, 2020, now U.S. Pat. No. 11,784,227, which is a national phase application of and claims priority to International Patent Application No. PCT/US2018/055089, filed Oct. 9, 2018, which claims the benefit of U.S. Provisional Patent Application No. 62/571,820, entitled "Method For Fabricating Wafer Scale/Nano Submicron Gap Electrodes And Arrays Via Photolithography," filed Oct. 13, 2017, the contents of each of which is hereby incorporated by reference in their entirety.

BACKGROUND

This application is related to devices with a non-gap formed between two electrodes and a method of fabricating these devices.

SUMMARY

A electronic device and a fabrication method is provided. The electronic device having a first electrode and a second electrode. A nano-gap is formed between first and second electrode. The first electrode, the second electrode and the gap may be located in the same layer of the device.

DETAILED DESCRIPTION

Figure 1A:
FIG. 1A is a side view of a substrate of a disclosed device.

In one aspect of the current disclosure a single layer electronic device is provided. The device may include a first electrode, a second electrode, and a gap. The first electrode may be located in the same layer as the second electrode. The gap may be in the same layer as the first and second electrode and extend between the first and second electrode. The gap may be between about 50 nm and 100 nm wide. The gap may be an air gap and the gap may be void of any solid materials. The gap may extend substantially along the length of the first electrode and/or second electrode. In another dimension, the gap may extend substantially along the height of the first and/or second electrode.

The device may include a 2D material layer that extends over the gap between the first electrode and the second electrode. The 2D material layer comprise graphene. The 2D material layer may be between one and three atoms thick.

In another aspect of the disclosure the device may be a transistor or a sensor. In one implementation the device may be a gas sensor. The gas may determined in response to the resistivity between the first and second electrodes. Further, the gas may determined in response to the resistivity of the 2D layer.

The 2D material layer may be at least one of Fe doped, Cr doped, Mg doped, Nitrogen doped and Al doped. As such, the characteristics of the 2D material may be enhanced for certain gas types based on the doping.

In another aspect of the disclosure, a method for generating an electronic device may be disclosed. The method may include the steps of patterning a first electrode by metallization; forming an oxide layer on the first electrode which overhangs the first electrode; patterning a second electrode by metallization. The oxide layer overhanging the first electrode may cause a gap to form between the first and second electrode. The first and second electrodes may be formed using photo-lithography. The oxide layer may be grown between 12 and 48 hours at a temperature between 40° C. to 120° C. The oxide layer may overhang the first electrode by between 3 nm and 100 nm. The method may include etching away the oxide layer.

Two Dimensional (2D) materials are attracting lot of attention in recent years because of their unusual properties that stem from their quantum and surface effect. Among them, graphene has extraordinary properties like super thin, transparent, highly conductive and high mechanical strength. Many 2D nanostructures hold great potential for many electronic and optoelectronic applications. These materials may have physical properties like low friction and robustness and have been widely used as a solid lubricant, as catalyst for hydrodesulfonization, and for photoelectrochemcial hydrogen production. They may be formed from of stack of atomic layers where all planes are held together by weak Van der Waals forces. This weak interlayer can be exfoliated mechanically to get single 2-D layer. In contrast some materials in the 2D domain like MoS2 which shows indirect bandgap in bulk mode whereas single layer has a direct band gap which is suitable for many semiconductor applications. Single layered TMDs field effect transistors have been successfully demonstrated which represent this semiconductor has potential to miniaturize the vertical dimension of future integrated circuits (IC) and sensor field.

Some 2-D materials may be used in some optoelectronics high mobility displays in thin film transistor, microfluidic applications and efficient biosensor devices by tuning its band gap with thickness, surface energy and strain control. Despite of direct band gap and high mobility like silicon, the performance and reliability of such layered crystal may be easily affected by the substrate and environmental interaction. For example, single layer MoS2 on less dielectric material may influence its field effect mobility and on-off ratio, which is assumed to be graded down 0.1-10 cm$^2$ V−1 s−1. Interaction between substrate and 2-D materials imply that interface control may be vital for performance of devices. The surface of the support substrate may be highly disordered topographically as well as chemically for such thin nanomaterials, which may create a scattering phenomenon and reduce the overall mobility. For example, Substrates like $SiO_2$ which hold these atomic layers may have highly disordered morphology and chemically active because of trapped atmospheric gases, chemical adsorbates, unknown functional groups and charge along with corrugation. So, adding another layer of 2-D materials on the top of $SiO_2$ may not contribute clearly which may lead to unreliable function of every single device. Various attempts have been taken to increase the mobility of 2D nanomaterials by upgrading the substrate. High dielectric medium can be useful to reduce coulombic scattering and increase the mobility of the film. Using a thin layer of electrolyte PEO and $LiClO_4$ may increase the mobility and reduce the contact resistance. PMMA can give high dielectric support and enhance the mobility of the $MoS_2$ by avoiding chemical bonding and surface roughness at $SiO_2$ interface. So, to reduce trapping of charges at the interface and upgrade transport properties, 2D material may be suspended without any support. Which seems a promising strategy towards high sensitive sensors and digital electronics devices. Suspended 2D material shows more mobility than an unsuspended one.

The microfabrication techniques of creating nano gaps between electrode such as electron beam lithography are not capable of producing large scale of devices. In addition, scanning probe microscopy for creating nano gaps between two electrodes are impractical for mass production devices. Suspended 2-D material devices may be fabricated by new type of lithography technique to create single or arrays of nanogap electrodes for wafer scale fabrication of devices in sensor domain. These types of sensors may provide low cost, low power, sensitive, selective, small form factor which has feasibility to integrate low power wireless network for sense-making, data analytics and auto-calibration of continuous monitoring pollutant and harmful pathogens present in water and air.

FIG. 1A is a side view of a substrate of a disclosed device. The substrate 112 may be formed of various materials as described throughout this application.

Figure 1B:
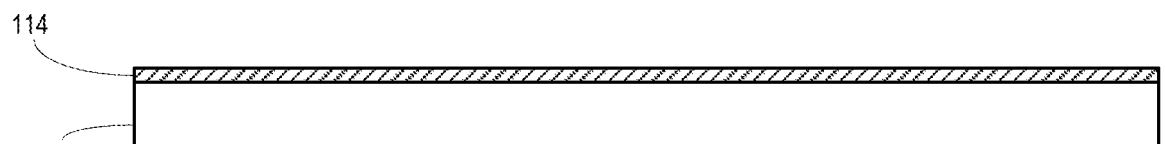
FIG. 1B is a side view of a first step in forming the disclosed device.

FIG. 1B is a side view of a first step in forming the disclosed device. A sacrificial (e.g. lift of resist or LOR) layer 114 is deposited on the substrate 112.

Figure 1C:
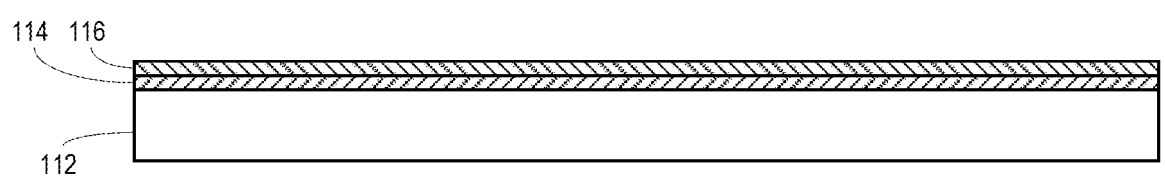
FIG. 1C is a side view of a second step in forming the disclosed device.

FIG. 1C is a side view of a second step in forming the disclosed device. A photoresist layer 116 is deposited on the substrate 112 over the sacrificial layer 114. The photoresist layer 116 may be a 1811 coating applied by spinner at 3000 rpm.

Figure 1D:
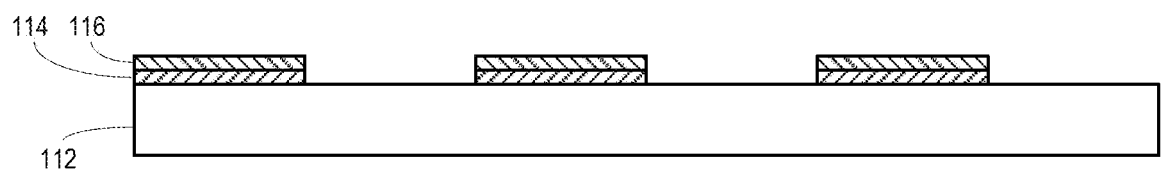
FIG. 1D is a side view of a third step in forming the disclosed device.

FIG. 1D is a side view of a third step in forming the disclosed device. The device is exposed and developed removing portions of the photoresist layer 116 and the sacrificial layer 114.

Figure 1E:
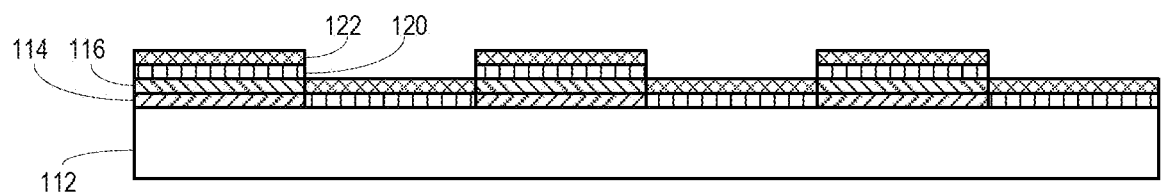
FIG. 1E is a side view of a fourth step in forming the disclosed device.

FIG. 1E is a side view of a fourth step in forming the disclosed device. An electrode layer 120 (e.g. gold or titanium) is deposited on the device, then an expansion layer 122 (e.g. Cr or $Cr_xO_y$) is deposited on the device over the electrode layer 120.

Figure 1F:
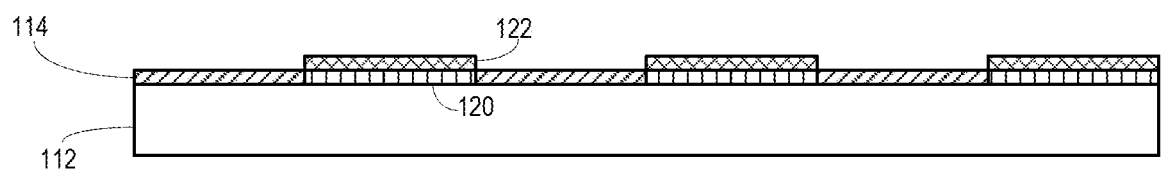
FIG. 1F is a side view of a fifth step in forming the disclosed device.

FIG. 1F is a side view of a fifth step in forming the disclosed device. The photo resist layer 116, as well as, any of the expansion layer 122 and electrode layer 120 that were deposited over photo resist areas is removed.

Figure 1G:
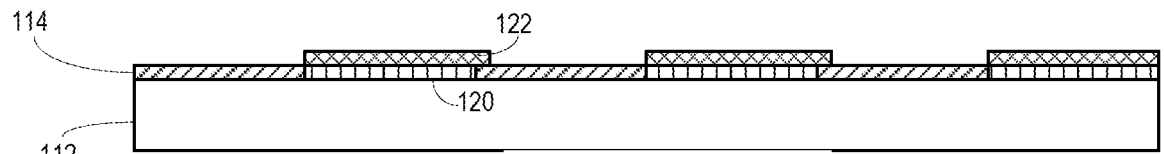
FIG. 1G is a side view of a sixth step in forming the disclosed device.

FIG. 1G is a side view of a sixth step in forming the disclosed device. The expansion layer 122 is allowed to expand, for example by oxidation and/or control of temperature. Accordingly the expansion layer 122 continues to cover the electrode layer 120 but also covers a very small portion (e.g. 10-150 nm) of the sacrificial layer 114.

Figure 1H:
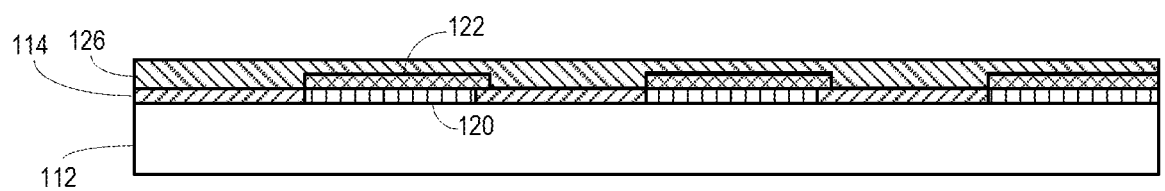
FIG. 1H is a side view of a seventh step in forming the disclosed device.

FIG. 1H is a side view of a seventh step in forming the disclosed device. A photoresist layer 126 is then deposited onto the device over the other layers.

Figure 1I:
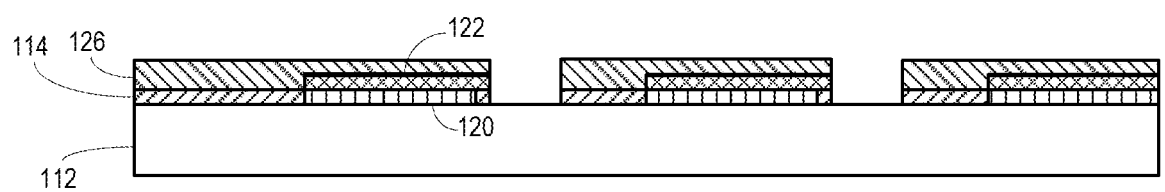
FIG. 1I is a side view of a eight step in forming the disclosed device.

FIG. 1I is a side view of a eight step in forming the disclosed device. The device is exposed and developed removing corresponding portions of the photoresist layer 126 and the sacrificial layer 114. The expanded portion of the expansion layer 122 maintains a small portion (e.g. 10-150 nm) of the sacrificial layer 114 next to the electrode layer 120.

Figure 1J:
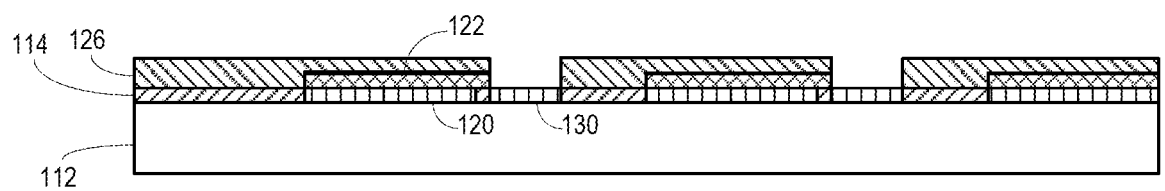
FIG. 1J is a side view of a ninth step in forming the disclosed device.

FIG. 1J is a side view of a ninth step in forming the disclosed device. A second electrode layer 130 (e.g. gold or titanium) is deposited on the substrate adjacent to the electrode layer 120 next to the small portion of the sacrificial layer 114.

Figure 1K:
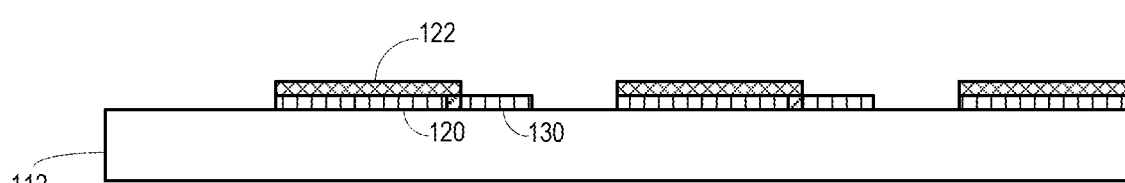
FIG. 1K is a side view of a tenth step in forming the disclosed device.

FIG. 1K is a side view of a tenth step in forming the disclosed device. The photoresist layer 126 and the sacrificial layer 114 may be stripped away.

Figure 1L:
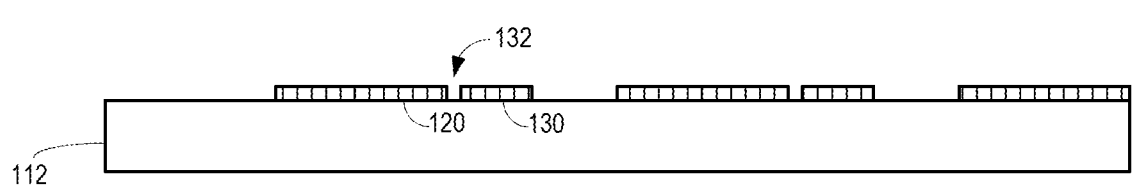
FIG. 1L is a side view of a eleventh step in forming the disclosed device.

FIG. 1L is a side view of a eleventh step in forming the disclosed device. The expansion layer 122 and any remaining sacrificial layer 114 may be removed, leaving a device with two electrodes 120, 130 separated by a nanogap 132.

Fabrication Steps

Nanogap electrodes may be fabricated by photo-lithography technique, which includes thermally grown 300 nm oxide layer on 330 μm Silicon wafer (can be used some other insulating flexible substrate for patterning electrodes). By using lift of method, first electrode layer is patterned by metallization via electron beam evaporation of 10 nm of Titanium, 80 nm of Gold and 100 nm of Chromium layers as shown in FIG. 1A-F. FIG. 1F, the wafer may be kept in ambient temperature for overnight that results in an oxide layer CrxOy forming. The oxide layer overhangs few nanometers to 100× nm depending upon the temperature (40° C. to 120° C.) on the edges of Ti/Au. Following FIG. 1G, a similar method has been used to deposit second electrode of Ti/Au. While depositing the second electrode, enlargement of CrxOy in few nanometers protect second electrode (Ti/Au) to meet first electrode and creates nanometer spacing. The photoresist may be stripped by using acetone whereas the chromium/chromium oxide layer may be etched in chromium etchant solution and two Ti/Au electrodes are formed which is separated by nano-gap retained on Si/SiO$_2$ wafer.

Figure 2:
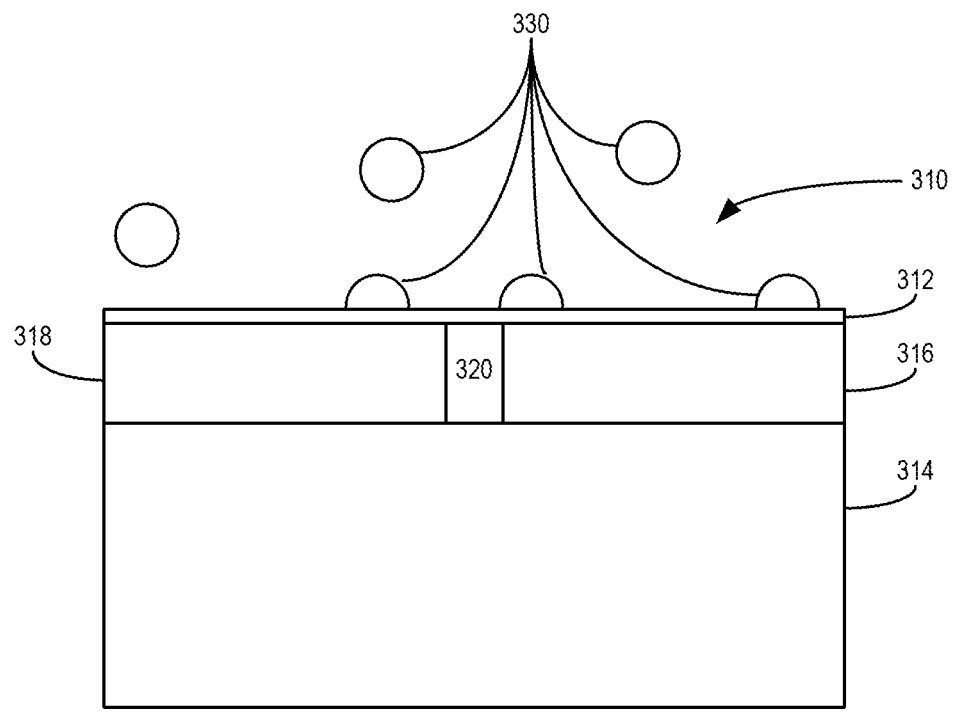
FIG. 2 is a side view of a gas sensor according to the present disclosure.
Figure 3:
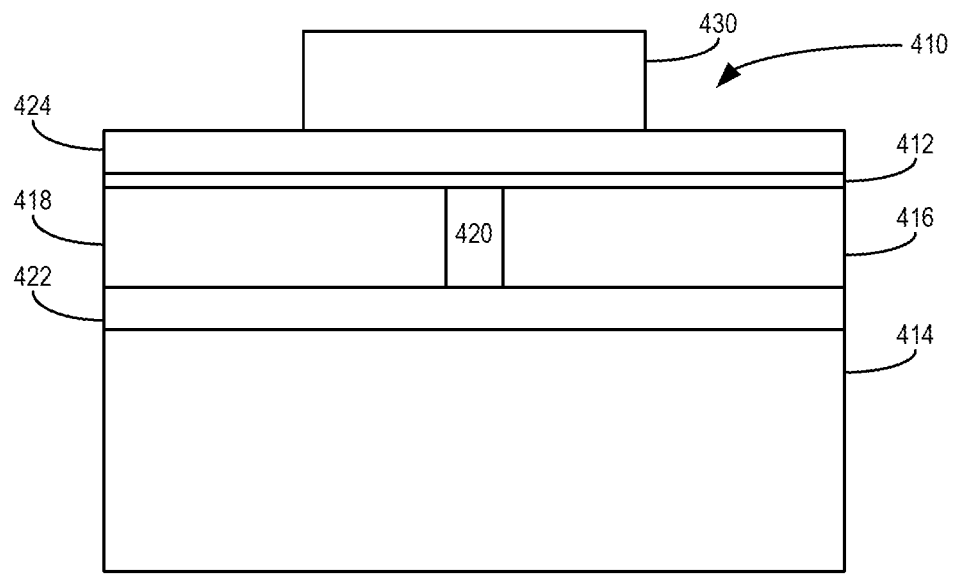
FIG. 3 is a side view of a top gate transistor according to the present disclosure.
Figure 4:
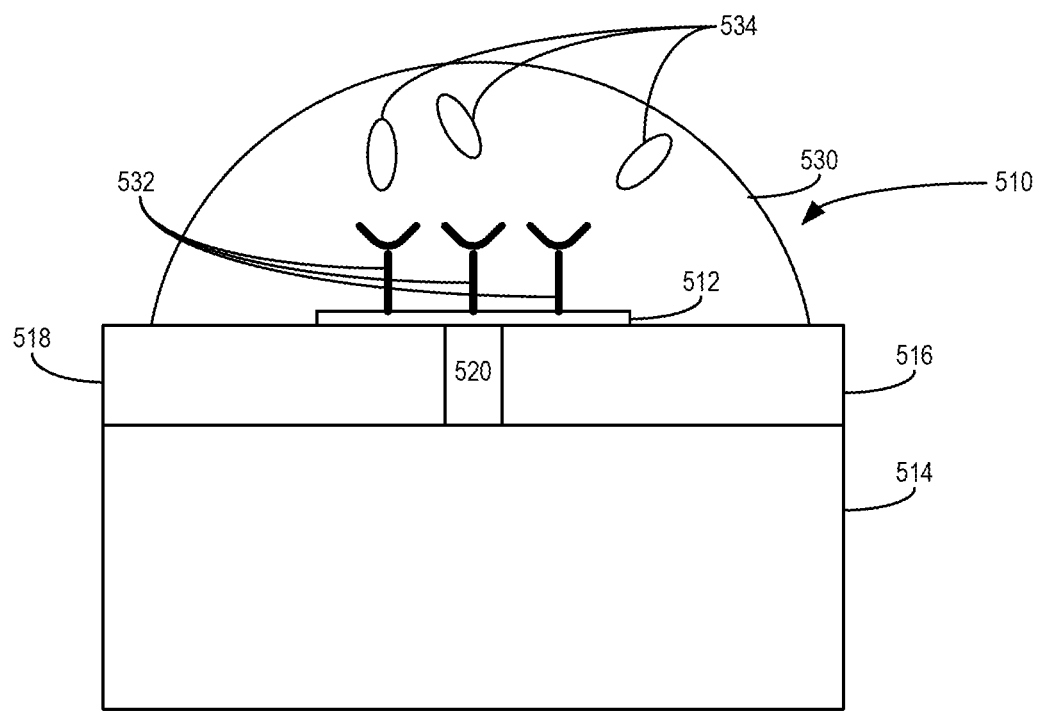
FIG. 4 is a side view of a bio-sensor according to the present disclosure.
Figure 5:
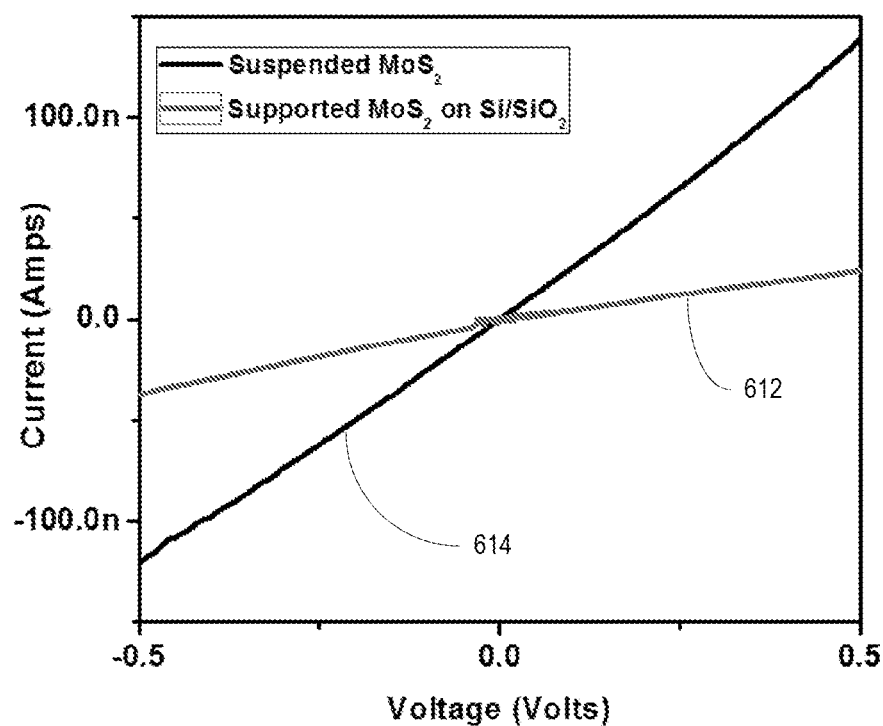
FIG. 5 is graph illustrating a comparison of the attributes of a suspended device and a supported device.

Fabricated nano-gap electrodes may be provided on diverse substrates. Arrays of electrodes may be patterned on SiO$_2$/Si substrate by using a photolithography method. Flexible substrates have been used to fabricate the nano-gaps for different applications. After achieving nano-gaps, 2D material may be transferred on the top of electrodes by using micro-manipulator as shown in FIGS. 2, 3, and 4. A nano-gap may provide a small enough space so that the 2D materials is not allowed to touch the substrate. These suspended 2D material on the top of nano-gap can show 10 times higher electron mobility than supported one because of reducing scattering effect from the substrate morphology as shown in FIG. 5. Line 612 illustrates the attributes of a supported device where the 2D material may touch the substrate. Line 614 illustrates the attributes of a suspended device that uses a nano-gap according to this disclosure and may not touch the substrate.

2D materials (Graphene, transition metal dichalcogenides such as MoS2, MoSe2 and phosphorene) have fascinating properties in different applications. The family of two-dimensional materials, have shown great potential for different sensing applications because of high surface-to-volume ratio, sensitivity and low noise of electronic properties to the changes in the surroundings.

FIG. 2 is a side view of a gas sensor 310 according to the present disclosure. The gas sensor 310 includes a substrate 314, a first electrode 316, a second electrode 318, and a 2D layer 312 (e.g. a single atom layer of graphene or other 2D material disclosed herein). The first electrode 316 and the second electrode 318 are disposed on the substrate 314. The nano-gap 320 is located between the first electrode 316 and the second electrode 318. The 2D layer 312 is disposed over a nano-gap 320. The nano-gap 320 may be formed as discussed above with regard to FIG. 1. The 2D layer 312 of the gas sensor may interact with the gas molecules 330 when present, there by changing the electron mobility between the first electrode 318 and the second electrode 316. Using the nano-gap 320 provides superior performance, for example by eliminating any scattering due to the substrate.

2D materials offer a promising platform for the advancement of ultra-high sensitive and highly selective gas sensors by tailoring their surface chemistry without changing their unique electrical and optical properties. For specific detection of gases from air like SOx, Cr and Mg may be used as a dopant whereas Fe-doped graphene may fabricate for precise detection of H2S. Nitrogen and Al doped may be the best selective sensing for CO, NOx. Out of the measured gases, the adsorption of SOx, NOx and H2O (moisture) may decrease the resistivity of 2D materials which shows their electron acceptor nature, whereas the adsorption of CO and NH3 may lead to increase in resistivity which indicated their electron donor in nature. These suspended 2D materials on nano-gap electrodes can be useful for measurement of pH, conductivity and Dissolved Oxygen expected to give high accuracy, and fast response time and excellent sensitivity in the shock tests. Development of chemically modified sensors for electrochemical measurement of metals namely As, Pb, Cr, Pb etc. based on nano-gap sensors incorporated with microfluidic platforms and functionalized nanosheet can be useful for real time monitoring.

FIG. 3 is a side view of a top gate transistor according to the present disclosure. The transistor 410 includes a substrate 414, a first electrode 416 (e.g. a drain), a second electrode 418 (e.g. a source), a third electrode 430 (e.g. a gate), and a 2D layer 412 (e.g. a single atom layer of semiconductor material, such as $WS_2$, $WSc_2$). The first electrode 416 and the second electrode 418 are disposed on a layer 422 (e.g. $SiO_2$) which is disposed on the substrate 414. The nano-gap 420 is located between the first electrode 416 and the second electrode 418. The 2D layer 412 is disposed over a nano-gap 420. The nano-gap 420 may be formed as discussed above with regard to FIG. 1. The 2D layer 412 may be connected with a gate electrode 430 through an oxide layer 424. As such, the transistor may have a top gate configuration with the gate 430 deposited on the oxide layer 424 which is deposited on the 2D layer 412. Using the nano-gap 420 provides superior performance, for example by eliminating any scattering due to the substrate 414.

Field effect transistor (FET) sensor for electrochemical sensing can be fabricated on this device. For instance, insulating layer modified with specific antibodies, enzymes, and aptamers can be deposit on suspended device to recognize different pesticides and harmful pathogens. This type of structure can be useful for sensing flowrate of water and other aqueous solution very precisely because of the tuning hydrophobicity of 2D materials.

FIG. 4 is a side view of a bio-sensor according to the present disclosure. The bio-sensor 510 includes a substrate 514, a first electrode 516, a second electrode 518, and a 2D layer 512 (e.g. a single atom layer of graphene or other 2D material disclosed herein). The first electrode 516 and the second electrode 518 are disposed on the substrate 514. The nano-gap 520 is located between the first electrode 516 and the second electrode 518. The 2D layer 512 is disposed over a nano-gap 520. The nano-gap 520 may be formed as discussed above with regard to FIG. 1. The 2D layer 512 of the bio-sensor may interact with the antibodies 532 (e.g. protein molecules that bond to specific contaminants 534), thereby changing the electron mobility between the first electrode 518 and the second electrode 516. For example a water droplet 530 may be placed on the bio-sensor 510 as the contaminates 534 (e.g. E-coli or other target bacterial or viral agents) in the water bond with the antibodies 532 attached to the 2D layer 512, the electron mobility from the first electrode 516 to the second electrode 518 changes to identify the presence of the target contaminant. Using the nano-gap 520 provides superior performance, for example by eliminating any scattering due to the substrate.

Freestanding 2D nano-gap device can be used for building precise CMOS inverter and different logic gates. The overall device behavior can be explained by mobility of electron through these 2D materials. For instance, CMOS inverter by combining MoSe2 PMOS and MoS2 NMOS transistor and study its electrical performance like current on/off ratio, high field effect mobility at room temperature to achieve heterogeneous integration of semiconducting 2D materials as a novel channel for next generation micro-electronics applications.

From this suspended 2D pattern electrodes various types of sensor and electronic devices can be built. For smart sensing mechanism by functionalizing 2D nanomaterials for selective detection as well as via incorporating different mechanism (microfluidics, FET etc.). Nano-gap suspended design and specific dopant demonstrate high response time and sensitive improvement in terms of percentage absorption of various gases, harmful pathogens and pollutants present in environment. Wafer scale fabrication by a photolithography technique provides low cost smart sensors imbued with sense-making, data analytics and auto-calibration capabilities.

Using 2D materials, researchers have demonstrated some optoelectronics high mobility display in thin film transistor and efficient sensor devices by tuning its band gap with thickness, surface energy and strain control. Despite of direct band gap and high mobility like silicon, the performance and reliability of such layered crystal are easily affected by the substrate and environmental interaction. For example, single layer MoS2 on less dielectric material may influence its field effect mobility and turn on/off ratio. Interaction between substrate and MoS2 imply that interface control may be vital for performance of devices made up by atomic layer MoS2. Especially supporting substrate may have highly disordered morphology and chemically active because of traped atmospheric gases, chemical adsorbates, unknown functional groups and charge along with corrugation. So, adding another layer of 2D on the top of supporting substrate may not contribute clearly which can lead to unreliable function of every single device. So, to reduce trapping of charges at the interface and upgrade transport properties, 2D materials may be suspended without any support which seems a promising strategy towards high sensitive sensors and digital electronics devices. Accordingly, suspended single layer 2D devices on nano-gap electrodes can be fabricated by wafer scale photolithography technique to provide enhanced electronic properties.

As a person skilled in the art will readily appreciate, the above description is meant as an illustration of implementation of the principles this disclosure. This description is not intended to limit the scope or application of this system in that the system is susceptible to modification, variation and change, without departing from the spirit of this disclosure, as defined in the following claims.

The invention claimed is:

1. A method for generating an electronic device, the method comprising the steps of:
    patterning a first electrode on a substrate by metallization;
    forming an oxide layer on the first electrode which overhangs the first electrode onto a sacrificial layer that is adjacent to the first electrode and on top of the substrate;
    patterning a second electrode on the substrate and adjacent to the sacrificial layer by metallization such that the sacrificial layer is between the first electrode and the second electrode; and
    removing the oxide layer and the sacrificial layer, wherein the oxide layer overhanging the first electrode onto the sacrificial layer causes a gap to form between the first and second electrode when the sacrificial layer between the first and second electrode is removed, wherein the gap is a sub-micron gap.

2. The method according to claim 1, wherein the first and second electrodes are formed using photo-lithography.

3. The method according to claim 1, wherein removing the oxide layer comprises etching away the oxide layer.

4. The method according to claim 1, wherein the oxide layer is grown between 12 and 48 hours at a temperature between 40° C. to 120° C.

5. The method according to claim 1, wherein the oxide layer overhangs past the first electrode by between 3 nm and 100 nm.

6. The method according to claim 1, further comprising placing, via a micro-manipulator, a bottom surface of a two-dimensional (2D) material layer on top of the first electrode and the second electrode such the 2D material layer is suspended over the gap between the first electrode and the second electrode.

7. The method according to claim 6, wherein the 2D material layer comprises graphene.

8. The method according to claim 6, wherein the 2D material layer comprises MoS$_2$.

9. A method of fabricating an electronic device, comprising:
    patterning a first electrode on a substrate by metallization;
    patterning a second electrode on the substrate by metallization;
    depositing a sacrificial layer on the substrate;
    forming an expansion layer on the first electrode with a portion of the expansion layer overhanging the first electrode onto a portion of the sacrificial layer that is adjacent to the first electrode; and
    removing the expansion layer and the sacrificial layer, wherein a nano-gap is formed between the first electrode and the second electrode when the portion of the sacrificial layer between the first electrode and the second electrode is removed.

10. The method according to claim 9 further comprising removing portions of the sacrificial layer prior to the patterning of the first electrode.

11. The method according to claim 9, wherein the expansion layer comprises $Cr_xO_y$.

12. The method according to claim 9, wherein the portion of the expansion layer overhanging the first electrode is between 3 nm to 100 nm.

13. The method according to claim 9, wherein the expansion layer is allowed to expand after deposition at a temperature between 40° C. to 120° C.

14. The method according to claim 9, further comprising placing, via a micro-manipulator, a two-dimensional (2D) material layer on top of the first electrode and the second electrode after removing the expansion layer such that the 2D material layer is suspended over the nano-gap between the first electrode and the second electrode.

15. The method according to claim 14, wherein the 2D material layer comprises graphene or MoS$_2$.

16. The method according to claim 9, wherein the substrate comprises an SiO$_2$/Si wafer.

17. The method according to claim 9, wherein the first and second electrodes are formed using photo-lithography.

18. A method comprising:
    depositing a sacrificial layer on a substrate;
    depositing a photoresist layer on the sacrificial layer;
    removing portions of the photoresist layer and portions of the sacrificial layer;
    patterning a first electrode on the substrate by metallization such that the first electrode fills a space left by one of the removed portions of the sacrificial layer;
    forming an expansion layer on the first electrode such that the expansion layer expands onto a remaining portion of the sacrificial layer adjacent to the first electrode;
    patterning, by metallization, a second electrode on the substrate adjacent to the remaining portion of the sacrificial layer such that the remaining portion of the sacrificial layer is between the first electrode and the second electrode; and
    removing the expansion layer and the remaining portion of the sacrificial layer, wherein a nano-gap is formed between the first electrode and the second electrode when the remaining portion of sacrificial layer is removed.

19. The method according to claim 18 further comprising placing, via a micro-manipulator, a two-dimensional (2D) material layer onto the first electrode and the second electrode after removing the expansion layer such that the 2D material layer is suspended over the nano-gap between the first electrode and the second electrode.

20. The method according to claim 18 further comprising removing further portions of the sacrificial layer from the substrate after the forming of the expansion layer, wherein the removing further portions of the sacrificial layer leaves the remaining portion of the sacrificial layer on the substrate.

* * * * *